United States Patent [19]

Sanwo et al.

[11] Patent Number: 5,030,857
[45] Date of Patent: Jul. 9, 1991

[54] HIGH SPEED DIGITAL COMPUTER DATA TRANSFER SYSTEM HAVING REDUCED BUS STATE TRANSITION TIME

[75] Inventors: Ikuo J. Sanwo, San Marcos; Gregory H. Milby, San Diego; Quynh-Giao X. Le, Escondido, all of Calif.

[73] Assignee: NCR Corporation, Dayton, Ohio

[21] Appl. No.: 398,563

[22] Filed: Aug. 25, 1989

[51] Int. Cl.⁵ ............... H03K 19/017; H03K 19/092; H03K 19/096; G11C 15/49
[52] U.S. Cl. .................................. 307/475; 307/443; 307/452; 307/481; 323/315
[58] Field of Search .............. 307/443, 475, 240, 241, 307/242, 450, 451, 452, 453, 480, 481; 365/189.01

[56] References Cited

U.S. PATENT DOCUMENTS

| | | | |
|---|---|---|---|
| 4,488,066 | 12/1984 | Shoji | 307/452 |
| 4,498,021 | 2/1985 | Uya | 307/443 |
| 4,572,972 | 2/1986 | Shoji | 307/303 |
| 4,598,216 | 7/1986 | Lauffer et al. | 307/443 |
| 4,670,666 | 6/1987 | Yoshida | 307/246 |
| 4,761,567 | 8/1988 | Walters, Jr. et al. | 307/269 |
| 4,763,023 | 8/1988 | Spence | 307/480 |
| 4,918,329 | 4/1990 | Milby et al. | 307/443 X |

Primary Examiner—Stanley D. Miller
Assistant Examiner—David R. Bertelson
Attorney, Agent, or Firm—Wilbert Hawk, Jr.; Stephen F. Jewett; Gregory P. Gadson

[57] ABSTRACT

In a high speed digital computer data transfer system, data bus voltage swings between logic high and logic low levels are reduced by defining minimum and maximum bus voltages which lie between said logic levels, thus lowering bus transition and hence data transfer times. The output voltages are converted to the proper logic levels with the aid of a differential (sense) amplifier. The preferred embodiment is implemented using complementary metal-oxide-semiconductor (CMOS) technology.

20 Claims, 6 Drawing Sheets

| FIG. 3A | FIG. 3B | FIG. 3C |
|---------|---------|---------|

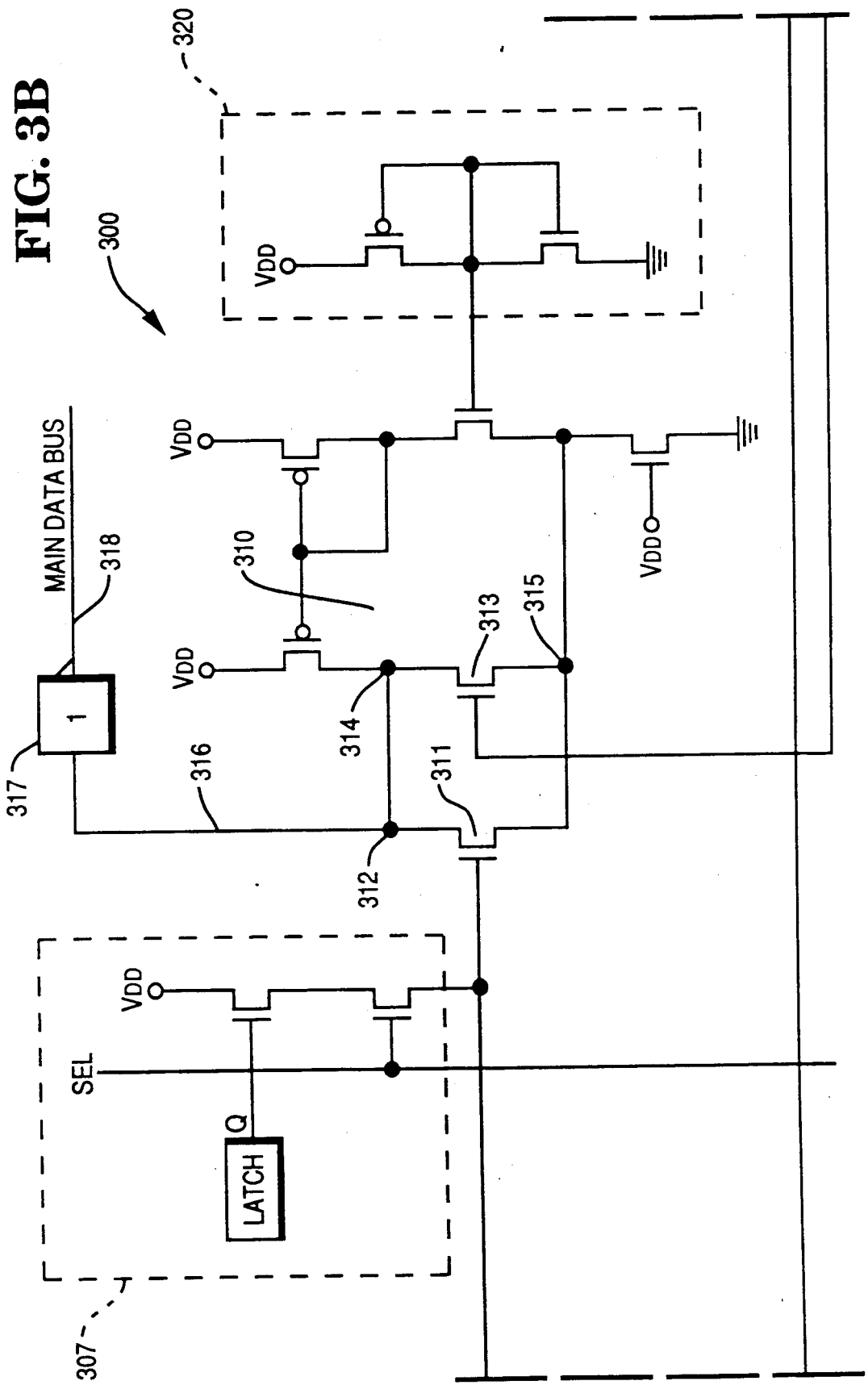

HIGH SPEED DIGITAL COMPUTER DATA TRANSFER SYSTEM HAVING REDUCED BUS STATE TRANSITION TIME

FIELD OF THE INVENTION

The present invention generally relates to computer data transfer systems, and more particularly to means for increasing the data transfer speed of data buses suitable for use in microprocessor chips.

BACKGROUND OF THE INVENTION

Prior art data transfer systems, such as the system 100 in FIG. 1, often contain a pre-charging transistor 102 coupled to the data bus 104 for precharging the bus 104 to a logic high level (e.g., 5 volts). This approach normally assumes that it is faster to pull the bus voltage down to a logic low level (e.g., 0 volts) from the logic high level, than the reverse. The pull-down transistors 106, 110 and 114 with their respective bus logic 108, 112 and 116 are operated to pull the bus voltage down to the logic low level by creating conduction paths to ground when activated.

The bus 104 is maintained at a logic high voltage, which voltage is nearly instantaneously available at an input of an inverter 118. The bus 104 is pulled down when a logic low voltage is to be provided to the inverter 118. Pre-charging can thus increase the operating speed of data transfer systems.

However, repeated pre-charging cycles without the intervention of a pull-down operation can raise the pre-charge voltage to such a high level that the overall advantage of pre-charging is lost since the time for going from the logic high voltage to the logic low voltage is directly proportional to the precharge voltage. Even where there is not repeated precharging, the bus transition time for changing from the logic high voltage level to the logic low voltage level, and vice versa, may still be undesirably large for some high-speed applications.

SUMMARY OF THE INVENTION

It is an object of the present invention to provide a data transfer system with high data transfer speed.

It is also an object of the present invention to decrease data bus voltage swings.

It is a further object of the present invention to provide a minimum bus voltage and a maximum bus voltage, both of which fall between the system logic high and logic low voltage levels.

It is another object of the present invention to provide such a restricted voltage swing system with a device for converting the bus voltages to the correct logic levels.

An additional object of the present invention is to implement such a data transfer system using complementary metal-oxide-semiconductor (CMOS) technology.

It is yet another object of the present invention to implement a data transfer system meeting the above objects in a microprocessor chip.

There is provided in accordance with the present invention a high speed digital computer data transfer system having reduced bus state transition time. The system has a data transfer bus, a clamping pre-charger connected to the bus for pre-charging and maintaining the bus at a first logic level, at least one bus interface logic circuit connected to the bus capable of selectively placing a second logic level voltage on the bus representing a logic high data state of the computer data transfer system, and a converter/output device connected to the bus for converting bus voltages at the first logic level to a third logic level representing a logic low data state of the computer data transfer system, and for outputting data at either the second or third logic levels. The first logic level is higher than the third logic level.

The details of the present invention will be revealed in the following description with reference to the aforementioned drawings.

DESCRIPTION OF THE PREFERRED EMBODIMENT

Figure 1:
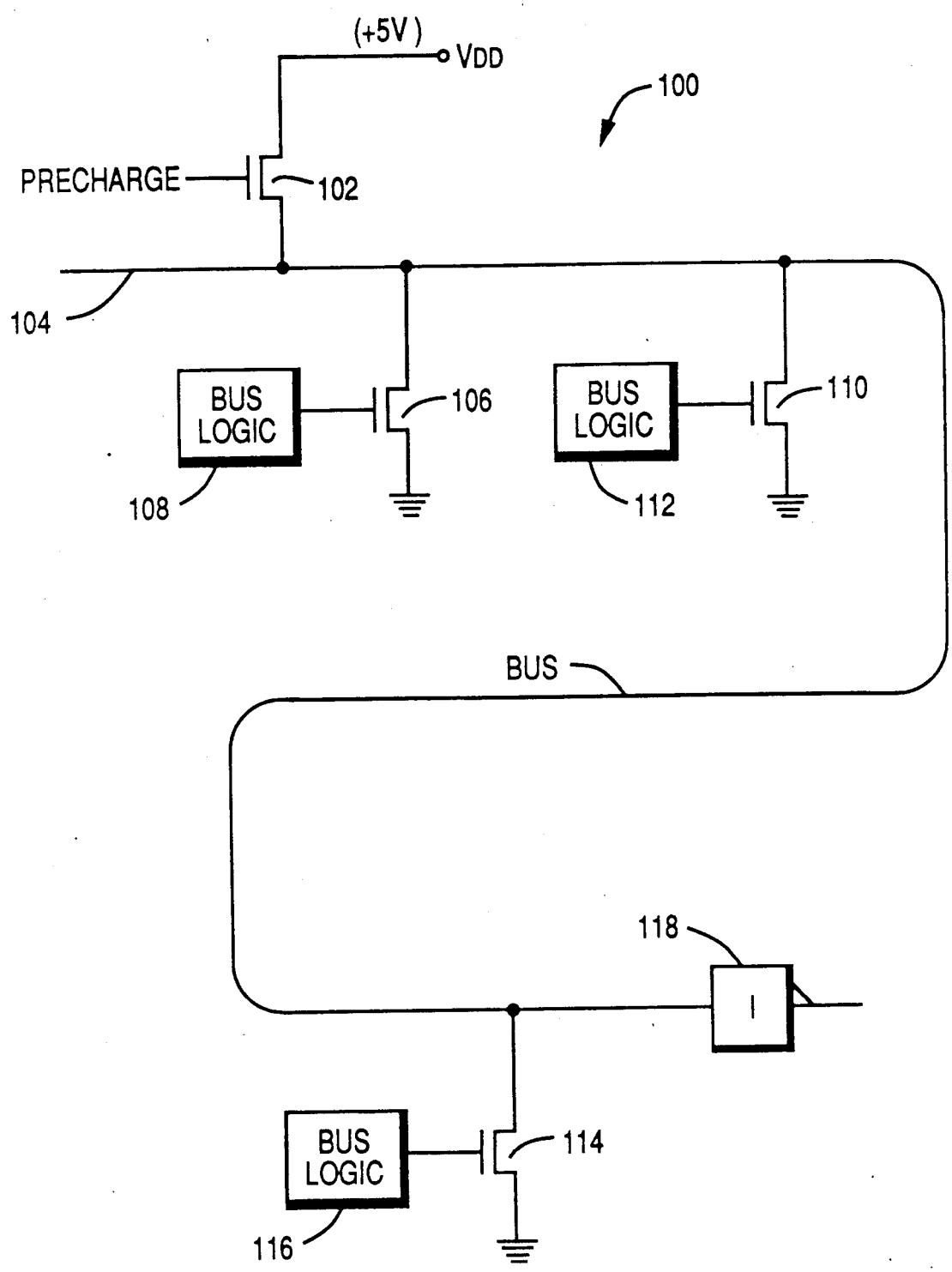
FIG. 1 is a generalized schematic diagram of a prior art data transfer system.
Figure 2A:
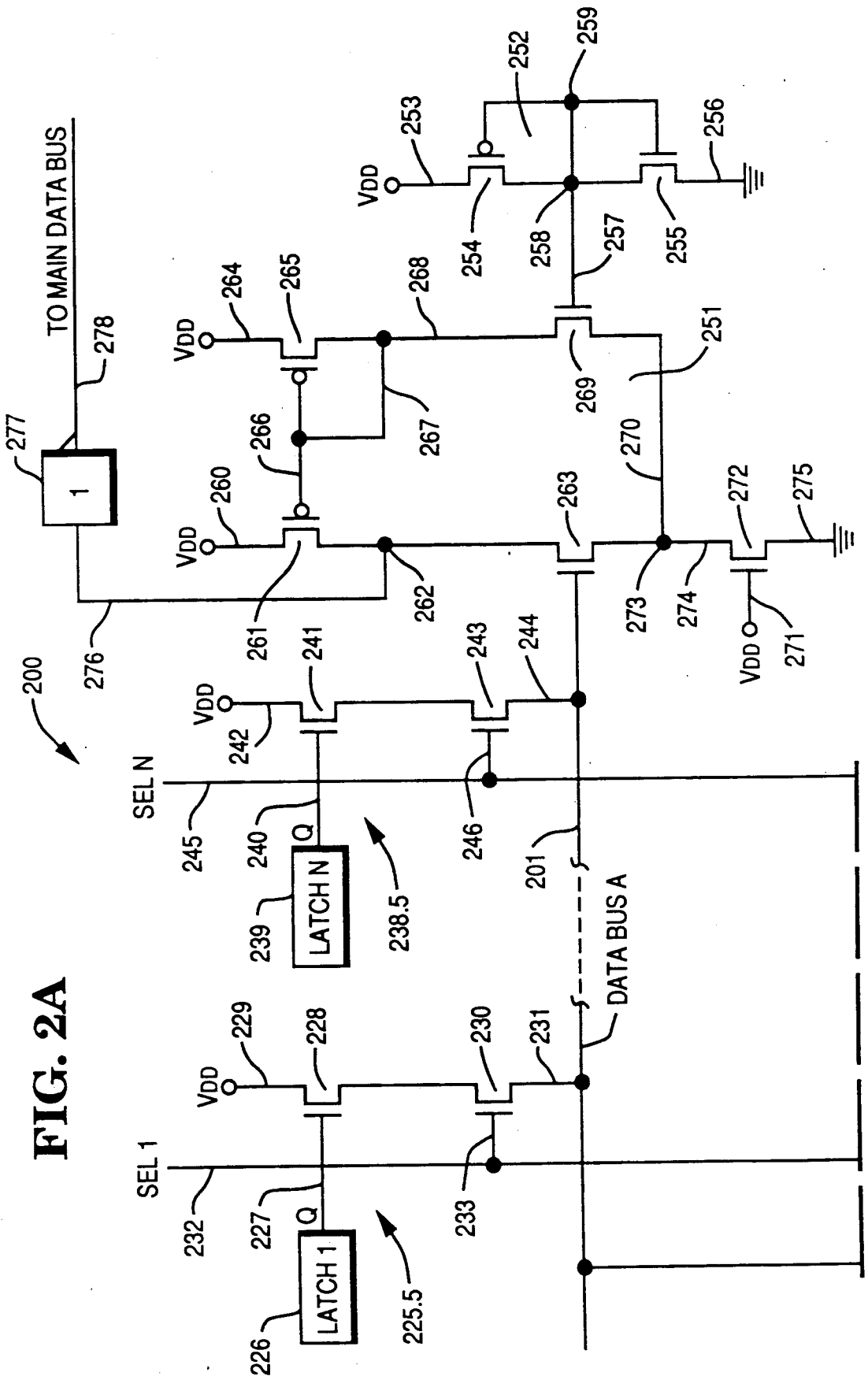
FIGS. 2A and 2B, when joined at their bold, dashed lines, form FIG. 2, a detailed schematic diagram of the preferred embodiment of the present inventive data transfer system.
Figure 2B:
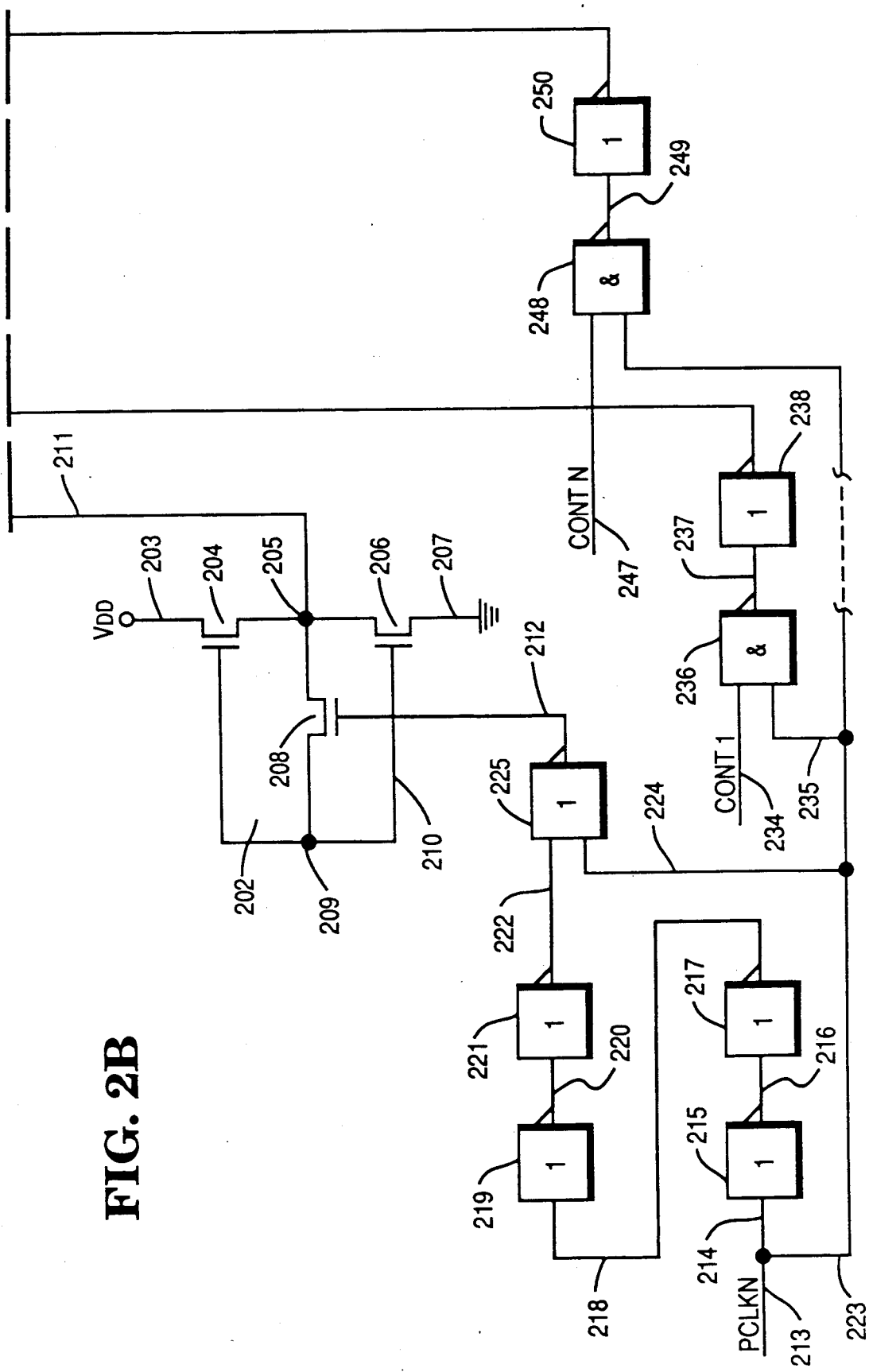

FIG. 2 (FIG. 2A joined with FIG. 2B) shows the preferred embodiment for a high speed computer data transfer system 200 implemented using CMOS technology and having a data transfer bus 201 that transfers data in the form of logic high and logic low voltages. All transistors are of the junction field-effect type (JFET), with a bubble at the gate indicating a p-channel device, and the absence of a bubble at the gate indicating an n-channel device.

A bus pre-charge/clamping circuit 202 charges and "clamps" the bus 201 to 2 volts during pre-defined pre-charge cycles. Transistors 204 (connected to a 5 volt power supply $V_{DD}$ at 203) and 206 (connected to ground at 207), through the voltage divider principle constitute a reference voltage generator for transferring the 2 volt pre-charge voltage via node 205 and line 211 to bus 201. As will be understood by those skilled in the art, the relative sizes of transistors 204 and 206 (which are gate-connected by line 210) are chosen to produce the 2 volt reference voltage. The reference voltage generator is enabled and disabled by the conduction and non-conduction, respectively, of transistor 208 connected between nodes 205 and 209.

The transistor or switch 208 is connected at its gate to control line 212. The control signal on line 212 is output from a control and delay circuit formed by inverters 215, 217, 219 and 221, and NOR gate 225. When a clocking signal PCLKN (at input 213) is in its logic low state, the pre-charge/clamping circuit 202 is enabled in the following manner. The clocking signal PCLKN beginning at path 214 is inverted by inverter 215, inverted via line 216 by inverter 217, inverted via line 218 by inverter 219, inverted via line 220 by inverter 221, and applied to an input 222 of the NOR gate 225. The other input 224 of the NOR gate 225 receives the signal PCLKN via line 223. Since both inputs of the NOR gate 225 are logic low values, the output of said gate is a logic high signal, which turns the transistor 208 on and activates the pre-charge/clamping circuit 202.

A latch 226, which stores data to be transferred on the bus 201, is part of a bus interface logic circuit 225.5 that also contains transistors 228 and 230. Although only two (225.5 and 238.5) are shown in FIG. 2, any number of bus interface logic circuits may be connected to the data bus 201. The latch 226 is connected to the gate of transistor 228 via line 227. Transistor 228 is also connected to the power source $V_{DD}$ at input 229 and to transistor 230, which transistor 230 is connected to the bus 201 via line 231. The gate of the transistor 230 is connected via line 233 to a select line 232 which carries a select signal SEL1. When SEL1 is a logic high signal the transistor 230 conducts such that when the latch 226 stores a logic high datum, transistor 228 also conducts to thereby pass the voltage $V_{DD}$ minus a voltage drop to the bus 201. The voltage drop of the transistors 228 and 230 is such that the voltage of the signal passed to the bus 201 is about 3 volts. Additionally, when the signal SEL1 is high and the datum transferred by the latch 226 is low, the transistor 228 is turned off, and the bus interface logic circuit does not contribute the voltage of the bus 201. When SEL1 is low, the bus interface logic circuit 225.5 is inoperative, and the bus 201 remains at the pre-charged level of 2 volts.

The select signal SEL1 is produced as follows. A control signal CONT1 is applied (from outside of the circuit shown in FIG. 2) to the first input 234 of a NAND gate 236, while the clocking signal PCLKN is applied to the second input 235. Only one of the control signals (CONT1-CONTN) is active at any given time. When both CONT1 and PCLKN are high a logic low signal is applied via line 237 to inverter 238, which outputs a logic high version of SEL1 on the select line 232. As can be seen, the bus interface logic circuit is disabled when either CONT1 or PCLKN is in a logic low state.

The bus, interface logic circuit 238.5 functions identically to the circuit 225.5, with elements 239–246 being equivalent to the elements 226–233, respectively. Also, elements 247–250 are identical to elements 234–238, respectively. Again, any number of bus interface logic circuits can be included in the system 200. Only one bus interface logic circuit is operational at any given moment.

The arrangement of the circuit 200 is such that precharging and clamping occur when PCLKN is low, and data can only be transferred by the bus interface logic circuits when PCLKN is high. The inverters 215, 217, 219 and 221 add appropriate delay to the pre-charging/clamping process to avoid the onset of that process while data are still being transferred on the bus 201.

The bus 201 is connected to the gate of a transistor 263 in a differential amplifier 251 which has a reference voltage supplied via line 257 to the gate of its transistor 269 by a reference voltage generator 252. The reference voltage generator 252 has a transistor 254 connected to the power source $V_{DD}$ at 253, and via nodes 258 and 259 to a transistor 255 (which is connected to ground at 256). The transistors 254 and 255 are sized relative to each other such that a reference voltage of 2.5 volts is supplied to the differential amplifier 251.

Having an amplification factor of approximately 10, the differential amplifier 251 has load transistors 261 and 265 supplied (via lines 260 and 264, respectively) by the power source $V_{DD}$, and which are connected at their gates by line 266. The gates of transistors 261 and 265 are also connected via line 267 to the drain of the transistor 265 and to the source of transistor 269 (via line 268). The input transistors 263 and 269 are connected via line 270 and node 273 to a constant current-source consisting of a transistor 272 having its gate connected to the power source $V_{DD}$ via line 271, and which is connected to ground via line 275. The differential amplifier 251 functions in a manner well-known in the art.

The output of the differential amplifier 251 is carried by a line 276, inverted by an inverter 277, and is finally output to one line of a main data bus (not shown) via a system output line 278.

The data transfer system 200 briefly operates as follows. When the data transferred from the selected bus interface logic circuit are at the logic high level, the resulting data bus voltage (3 volts) causes the transistor 263 to conduct, thus pulling the output node 262 down to the logic low level. However, the inverter 277 converts the differential amplifier output to the logic high level. When the data transferred from the selected bus interface logic circuit are at the logic low level, the bus 201 remains at the 2 volt pre-charge level, which is insufficient to cause conduction by the transistor 263. In this case the differential amplifier output node 262 is at the logic high level. The output signal on line 276 is inverter by the inverter 277, and becomes a logic low signal on output line 278.

The voltage swings on the bus 201 are thus limited to approximately 1 volt, which decreases the bus state transition time—and ultimately decreases the bus data transfer time.

Figure 3A:
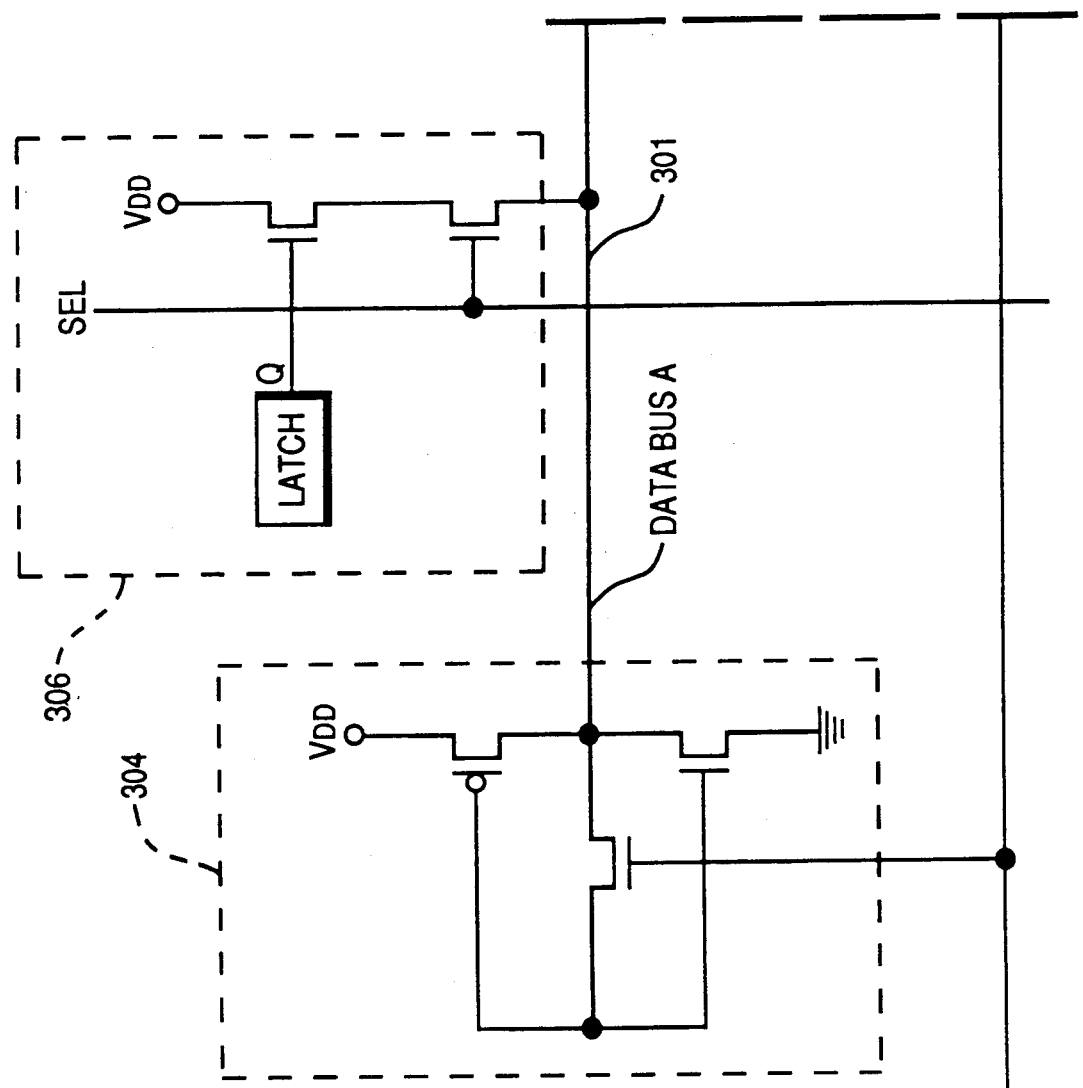
FIG. 3, which consists of FIGS. 3A, 3B and 3C appropriately joined, is a detailed schematic diagram of an alternate embodiment of the present inventive data transfer system.
Figure 3:
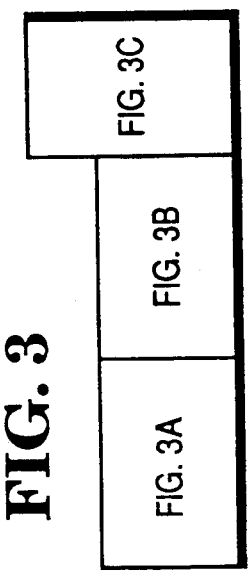
Figure 3C:
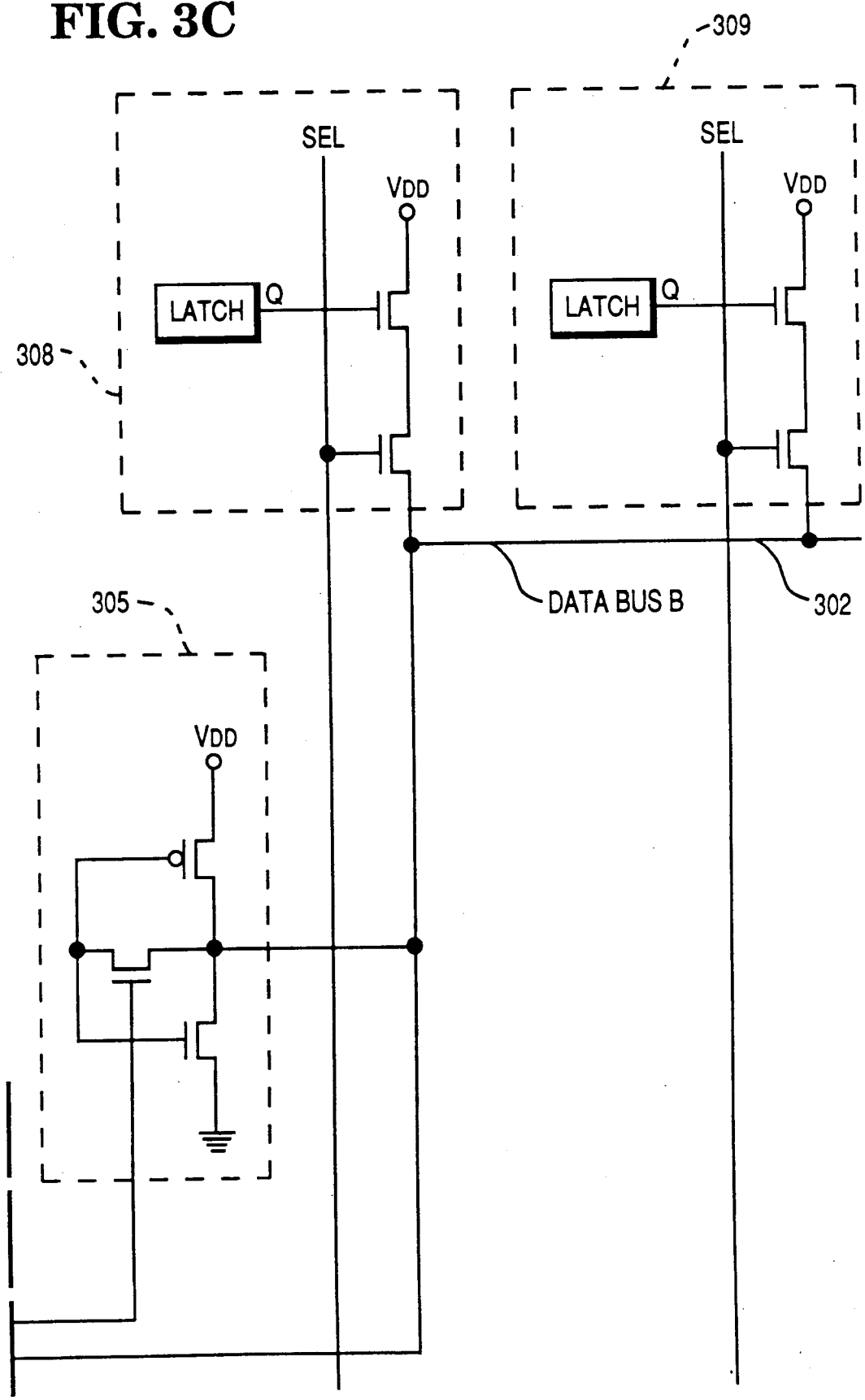

An alternate embodiment 300 appears in FIG. 3 (FIGS. 3A, 3B and 3C joined according to the diagram in FIG. 3). This embodiment divides the data bus 201 in FIG. 2 into two data buses 301 and 302 to minimize propagation delay and to improve the cycle time of the system. The components in FIG. 3 function substantially identical to the components in FIG. 2. A NOR gate 303 connects to the two precharge/clamping circuits 304 and 305, which pre-charge and clamp the busses 301 and 302, respectively. Bus interface logic circuits 306 and 307 (and others not shown) connect to bus 301, while bus interface logic circuits 308 and 309 (and others not shown) connect to bus 302.

The differential amplifier 310 and its reference voltage generator 311 correspond to components 251 and 252 in FIG. 2. Components 316, 317 and 318 are identical to components 276, 277 and 278 in FIG. 2. The input transistor 263 in FIG. 2 is replaced by two transistors 311 and 313, with transistor 311 being connected to bus 301 and transistor 313 being connected to bus 302. The two nodes 312 and 314 replace the node 262 in FIG. 2, and the node 315 corresponds to node 273 in FIG. 2. Thus, differential amplifier 310 converts the voltages on both bus 301 and bus 302 in much the same manner as the differential amplifier 251 in FIG. 2.

Variations and modifications to the present invention are possible given the above disclosure. However, such variations and modifications are intended to be within the scope of the invention claimed by this letters patent.

We claim:
1. A high speed digital computer data transfer system having reduced bus state transition time comprising:
a data transfer bus;
a clamping pre-charger coupled to said bus for pre-charging and maintaining said bus at a first logic level;
at least one bus interface logic circuit coupled to said bus capable of selectively placing a second logic level voltage on said bus representing a logic high data state of said computer data transfer system; and converter/output means coupled to said bus for converting bus voltages at the first logic level to a third logic level representing a logic low data state of said computer data transfer system, and for outputting data at either said second or third logic levels; said first logic level being higher than said third logic level.

2. The data transfer system in claim 1 wherein said converter/output means comprises a differential amplifier.

3. The data transfer system in claim 1 wherein said system is implemented using CMOS technology.

4. The data transfer system in claim 3 wherein said bus clamping pre-charger comprises a series-transistor reference voltage generator.

5. The data transfer system in claim 3 wherein each said bus clamping pre-charger comprises a latch for storing data to be placed on said bus.

6. A high speed digital computer data transfer system having reduced bus state transition time comprising:
   a plurality of data transfer busses;
   a clamping pre-charger coupled to each said bus for pre-charging and maintaining each said bus at a first logic level;
   at least one bus interface logic circuit coupled to each said bus capable of selectively placing a second logic level voltage on each said bus representing a logic high data state of said computer data transfer system; and
   converter/output means coupled to said busses for converting bus voltages at the first logic level to a third logic level representing of a logic low data state of said computer data transfer system, and for outputting data at either said second or third logic levels;
   said first logic level being higher than said third logic level.

7. The data transfer system in claim 6 wherein said converter/output means comprises a differential amplifier.

8. The data transfer system in claim 6 wherein said system is implemented using CMOS technology.

9. The data transfer system in claim 8 wherein each said bus clamping pre-charger comprises a series-transistor reference voltage generator.

10. The data transfer system in claim 8 wherein each said bus clamping pre-charger comprises a latch for storing data to be placed on said bus.

11. A high speed digital computer data transfer system having reduced bus state transition time comprising:
    a data transfer bus;
    a clamping pre-charger coupled to said bus for pre-charging and maintaining said bus at a first logic level;
    at least one bus interface logic circuit coupled to said bus capable of selectively placing a second logic level voltage on said bus; and
    converter/output means coupled to said bus for converting bus voltages at said first and second logic levels to third and fourth logic levels respectively, said third and fourth logic levels representing logic low and logic high data states respectively, of said computer data transfer system, and for outputting data at either said third or fourth logic levels;
    said first logic level being greater than said third logic level and said second logic level being less than said fourth logic level.

12. The data transfer system in claim 11 wherein said converter/output means comprises a differential amplifier.

13. The data transfer system in claim 11 wherein said system is implemented using CMOS technology.

14. The data transfer system in claim 13 wherein said bus clamping pre-charger comprises a series-transistor reference voltage generator.

15. The data transfer system in claim 13 wherein each said interface logic circuit comprises a latch for storing data, and means coupled to said latch for creating a voltage drop to change data voltages stored in said latch at said fourth logic level to said second logic level prior to placing voltages at said second logic level on said bus.

16. A high speed digital computer data transfer system having reduced bus state transition time comprising:
    a plurality of data transfer busses;
    a clamping pre-charger coupled to each said bus for pre-charging and maintaining each said bus at a first logic level;
    at least one bus interface logic circuit coupled to each said bus capable of selectively placing a second logic level voltage on each said bus; and
    converter/output means coupled to said busses for converting bus voltages at said first and second logic levels to third and fourth logic levels respectively, said third and fourth logic levels representing logic low and logic high data states respectively, of said computer data transfer system, and for outputting data at either said third or fourth logic levels;
    said first logic level being greater than said third logic level and said second logic level being less than said fourth logic level.

17. The data transfer system in claim 16 wherein said converter/output means comprises a differential amplifier.

18. The data transfer system in claim 16 wherein said system is implemented using CMOS technology.

19. The data transfer system in claim 18 wherein each said bus clamping pre-charger comprises a series-transistor reference voltage generator.

20. The data transfer system in claim 18 wherein each said interface logic circuit comprises a latch for storing data, and means coupled to said latch for creating a voltage drop to change data voltages stored in said latches at said fourth logic level to said second logic level prior to placing voltages at said second logic level on the bus coupled thereto.

* * * * *

REEXAMINATION CERTIFICATE (1920th)

United States Patent [19]

Sanwo et al.

[11] B1 5,030,857

[45] Certificate Issued  Feb. 2, 1993

[54] HIGH SPEED DIGITAL COMPUTER DATA TRANSFER SYSTEM HAVING REDUCED BUS STATE TRANSITION TIME

[75] Inventors: Ikuo J. Sanwo, San Marcos; Gregory H. Milby, San Diego; Quynh-Giao X. Le, Escondido, all of Calif.

[73] Assignee: NCR Corporation, Dayton, Ohio

Reexamination Request:
No. 90/002,560, Feb. 18, 1992

Reexamination Certificate for:
Patent No.: 5,030,857
Issued: Jul. 9, 1991
Appl. No.: 398,563
Filed: Aug. 25, 1989

[51] Int. Cl.⁵ .............. H03K 19/017; H03K 19/092; H03K 19/096; G11C 15/49
[52] U.S. Cl. ........................ 307/475; 307/443; 307/452; 307/481; 323/315

[58] Field of Search .............. 307/443, 473, 530, 475, 307/481, 530, 362, 355; 365/203, 189.01; 370/85.1

[56] References Cited

U.S. PATENT DOCUMENTS 4,634,890  1/1987  Lee ........................ 307/530
5,004,937  4/1991  de Oliveira et al. ............. 307/443

FOREIGN PATENT DOCUMENTS 58-33739  2/1983  Japan ........................ 307/443

*Primary Examiner*—Timothy P. Callahan

[57] ABSTRACT

In a high speed digital computer data transfer system, data bus voltage swings between logic high and logic low levels are reduced by defining minimum and maximum bus voltages which lie between said logic levels, thus lowering bus transition and hence data transfer times. The output voltages are converted to the proper logic levels with the aid of a differential (sense) amplifier. The preferred embodiment is implemented using complementary metal-oxide-semiconductor (CMOS) technology.

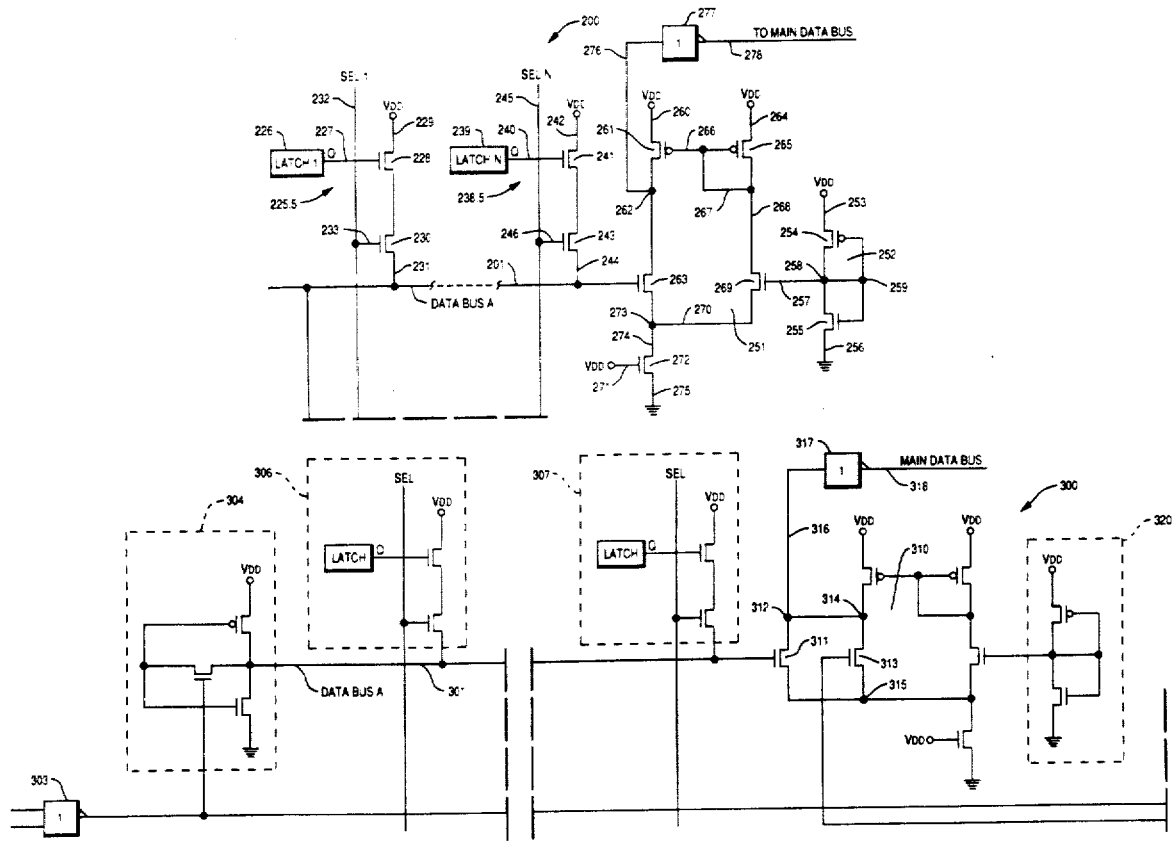

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-20 are cancelled.

* * * * *